United States Patent
Zhang et al.

(10) Patent No.: US 6,560,755 B1
(45) Date of Patent: May 6, 2003

(54) APPARATUS AND METHODS FOR MODELING AND SIMULATING THE EFFECT OF MISMATCH IN DESIGN FLOWS OF INTEGRATED CIRCUITS

(75) Inventors: Xisheng Zhang, Sunnyvale, CA (US); James Chieh-Tsung Chen, Santa Clara, CA (US); Zhihong Liu, Cupertino, CA (US); Jushan Xie, Campbell, CA (US); Xucheng Pang, Fremont, CA (US); Jingkun Fang, Santa Clara, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 230 days.

(21) Appl. No.: 09/648,396

(22) Filed: Aug. 24, 2000

(51) Int. Cl.⁷ .............................................. G06F 17/50
(52) U.S. Cl. ........................................................ 716/4
(58) Field of Search ............................... 716/4–18, 1–3; 703/13–17, 19

(56) References Cited

U.S. PATENT DOCUMENTS

| | | |
|---|---|---|
| 5,047,971 A | 9/1991 | Horwitz |
| 5,243,547 A | 9/1993 | Tsai et al. |
| 5,301,118 A | 4/1994 | Heck et al. |
| 5,373,457 A | 12/1994 | George et al. |
| 5,422,317 A | 6/1995 | Hua et al. |
| 5,517,506 A | 5/1996 | Underwood et al. |
| 5,519,848 A | 5/1996 | Wloka et al. |
| 5,581,742 A | 12/1996 | Lin et al. |
| 5,586,046 A | 12/1996 | Feldbaumer et al. |
| 5,646,870 A | 7/1997 | Krivokapic et al. |
| 5,655,110 A | 8/1997 | Krivokapic et al. |
| 5,666,288 A | 9/1997 | Jones et al. |
| 5,687,355 A | 11/1997 | Joardar et al. |
| 5,689,432 A | 11/1997 | Blaauw et al. |
| 5,754,454 A | 5/1998 | Pixley et al. |

(List continued on next page.)

OTHER PUBLICATIONS

Drennan, Patrick G., et al., "A Comprehensive MOSFET Mismatch Model", IEDM, 99, p. 167–170.

Guardiani, Carlo, et al., "Applying a submicron mismatch model to practical IC design", IEEE Custom Integrated Circuits Conference (1994), pp. 297–300.

Lakshmikumar, Kadaba R. et al., "Characterization and Modeling of Mismatch in MOS Trasnsistors for Precision Analog Design", IEEE Journal of Solid–State Circuits, vol. SC–21, No. 6 (1986), pp. 1057–1065.

Michael, Christoper et al., "Statistical Modeling of Device Mismatch for Analog MOS Integrated Circuits", IEEE Journal of Solid–State Circuits, vol. 27, No. 2 (1992), pp. 154–166.

(List continued on next page.)

*Primary Examiner*—Vuthe Siek
(74) *Attorney, Agent, or Firm*—Pennie & Edmonds LLP

(57) ABSTRACT

An exemplary method for simulating the effect of mismatch in design flows comprises receiving measured data, receiving an original model, extracting a mismatch model based on the measured data and the original model, attaching the mismatch model to the netlist to obtain a modified netlist, and simulating an effect of mismatch based on the modified netlist. In one embodiment, the extracting of a mismatch model includes selecting a set of model parameters, generating a distribution of mismatch values for each of the model parameters, extracting a set of linking coefficients based on said mismatch values, and extracting said mismatch model based on said set of linking coefficients. In another embodiment, the attaching of the mismatch model to the netlist includes determining a number of layers in the netlist, generating a copy of a lower layer in the netlist, the copy including a reference to a mismatch model definition, generating a copy of a higher layer in the netlist, replacing a reference to the lower layer in the higher layer by a reference to the copy of the lower layer, and generating a new model definition.

45 Claims, 13 Drawing Sheets

U.S. PATENT DOCUMENTS

| | | | |
|---|---|---|---|
| 5,754,826 A | * | 5/1998 | Bamal et al. ............... 395/500 |
| 5,764,948 A | | 6/1998 | Le Van Suu |
| 5,774,367 A | | 6/1998 | Reyes et al. |
| 5,774,382 A | | 6/1998 | Tyler et al. |
| 5,790,436 A | | 8/1998 | Chen et al. |
| 5,796,985 A | | 8/1998 | O'Brien et al. |
| 5,798,919 A | | 8/1998 | Suita et al. |
| 5,799,172 A | | 8/1998 | Gullapalli et al. |
| 5,802,349 A | | 9/1998 | Rigg et al. |
| 5,812,431 A | | 9/1998 | Kundert |
| 5,859,785 A | | 1/1999 | Kundert |
| 5,903,471 A | | 5/1999 | Pullela et al. |
| 5,949,983 A | | 9/1999 | Baxter |
| 5,958,073 A | | 9/1999 | White |
| 5,960,397 A | | 9/1999 | Rahim |
| 5,966,527 A | | 10/1999 | Krivokapic et al. |
| 5,999,714 A | | 12/1999 | Conn et al. |
| 5,999,717 A | | 12/1999 | Kaufmann et al. |
| 6,009,251 A | * | 12/1999 | Ho et al. ............... 395/500.06 |
| 6,018,623 A | | 1/2000 | Chang et al. |
| 6,018,624 A | | 1/2000 | Baxter |
| 6,021,271 A | | 2/2000 | Winter et al. |
| 6,053,947 A | | 4/2000 | Parson |
| 6,080,201 A | * | 6/2000 | Hojat et al. ............... 703/14 |
| 6,088,523 A | | 7/2000 | Nabors et al. |
| 6,090,151 A | | 7/2000 | Gehman et al. |
| 6,098,024 A | | 8/2000 | Chen et al. |
| 6,099,580 A | * | 8/2000 | Boyle et al. ............... 716/7 |
| 6,286,128 B1 | * | 9/2001 | Pileggi et al. ............... 716/18 |
| 6,301,687 B1 | * | 10/2001 | Jain et al. ............... 716/3 |
| 6,397,169 B1 | * | 5/2002 | Shenoy et al. ............... 703/14 |

OTHER PUBLICATIONS

Pelgrom, Marcel J.M. et al., "*Matching Properties of MOS Transistors*", IEEE Journal of Solid–State Circuits, vol. 24, No. 5 (1989), pp. 1433–1439.

Su, Hua et al., "*Yield Optimization of Analog MOS Integrated Circuits Including Transistor Mismatch*", IEEE (1993), pp. 1801–1804.

To, Hing–yan (Thomas) et al., "*A Flexible Parameter Mismatch Sensitivity Analysis for VLSI Design*" No date.

To, Hing–yan and Ismail, Mohammed, "*Mismatch Modeling and Characterization of Bipolar Transistors for Statistical CAD*", IEEE Transactions on Circuits and Systems—Fundamental Theory and Applications, vol. 41, No. 7 (1996), pp. 608–610.

Wong, Shyh–Chyi et al., "*A CMOS Mismatch Model and Scaling Effects*", IEEE Electron Device Letters, vol. 18, No. 6 (1997), pp. 261–263.

Wong, Shyh–Chyi et al., "*Characterization and Modeling of MOS Mismatch in Analog CMOS Technology*" Proc. IEEE Int. Conference on Microelectronic Test Structures, vol. 8 (1995), pp. 171–176.

Wong, Shyh–Chyi et al., "*On Matching Properties and Process Factors for Submicrometer CMOS*", Proceedings of IEEE International Conference on Microelectronic Test Structures, vol. 9 (1996), pp. 43–47.

* cited by examiner

APPARATUS AND METHODS FOR MODELING AND SIMULATING THE EFFECT OF MISMATCH IN DESIGN FLOWS OF INTEGRATED CIRCUITS

FIELD OF THE INVENTION

This invention relates to apparatus and methods for modeling and simulating the effect of mismatch. In particular, this invention relates to apparatus and methods for modeling and simulating the effect of mismatch in design flows of integrated circuits.

BACKGROUND OF THE INVENTION

Circuit designers typically use design tools to design integrated circuits. The most common design tools are the so-called simulated-program-with-integrated-circuit-emphasis (SPICE) and the fast device level simulators (e.g., Star-Sim, ATS, MACH TA, and TIMEMILL). Typically, design tools, such as SPICE and fast device level simulators, describe individual device and its connections in a line-by-line manner. Examples of individual devices are resistor, capacitor, inductor, bipolar junction transistor, and metal oxide semiconductor field effect transistor (MOSFET). In a design tool, each line, which includes a description of a device, is sometimes referred to as a device specification instance.

FIG. 1A illustrates an exemplary netlist developed by a design tool, such as SPICE. As shown in FIG. 1A, a netlist 101 typically includes three sections: a circuit description section 103, a models section 105, and an analysis section 107. The circuit description section 103 contains a description of each device and sub-circuit as well as interconnections between the devices and sub-circuits within an integrated circuit. The models section 105 contains a description of individual device and sub-circuit behavior. Typically, the models section 105 comprises a library of model parameters, model parameter values, and model equations. Generally, the behavior of each type of device (e.g., a MOSFET) can be simulated by at least one model equation, which includes a combination of model parameters. The analysis section 107 typically includes analysis instructions to simulate a device, sub-circuit, or circuit (e.g., output voltage over time) using information in the circuit description section 103 and the models section 105. In existing design tools, such as SPICE, simulations performed typically do not account for the effect of the mismatch phenomenon.

The mismatch phenomenon ("mismatch") can be defined as the difference in device performance for similarly/identically designed devices operating under the same bias conditions. The effect of mismatch is not limited to only among devices; mismatch in device characteristics can lead to performance differences among similarly/identically designed circuits operating under the same bias conditions. Generally, whether among devices or circuits, the performance difference caused by mismatch is not a constant but has a statistical distribution. In particular, the effect of mismatch is dependent on device geometry, distances between devices, layout style, and temperature applied to a device.

Mismatch is a limiting factor in both analog and digital circuitry. As the demand for more complex integrated circuits continues to drive the industry to reduce device geometry, the effect of mismatch becomes increasingly intolerable. Thus, although mismatch has long been recognized and characterized, the effect of mismatch has in recent years become a more important problem in integrated circuit design.

In order to safeguard against design specification failures caused by mismatch, some designers have adopted overly conservative design and simulation strategies. For example, devices are intentionally designed to have a larger geometry or placed in a particular layout style to minimize the effect of mismatch. Major drawbacks of this strategy include circuit performance degradation and an increase in cost due to an increase in chip area. In another strategy, global variation statistics are used to simulate the effect of mismatch, which is predominately a local effect. For example, a designer assigns parameter distributions to selected model parameters and performs Monte Carlo simulations based on those parameter distributions. Results obtained from such simulations typically over-estimate the effect of mismatch because a global variation generally does not account for mismatch dependence on device geometry, distances between devices, layout styles, and other factors.

Thus, it is desirable to provide apparatus and methods to more accurately and efficiently simulate the effect of device mismatch in integrated circuit design flows.

SUMMARY OF THE INVENTION

This invention provides apparatus and methods for modeling and simulating the effect of device mismatch in integrated circuit design flows. In particular, this invention is capable of modeling the effect of mismatch in individual devices or sub-circuits. Further, using such modeling information, the effect of mismatch can be simulated in design flows of integrated circuits.

An exemplary method for simulating the effect of mismatch in design flows comprises: receiving measured data, receiving an original model, extracting a mismatch model based on the measured data and the original model, attaching the mismatch model to a netlist to obtain a modified netlist, and simulating an effect of mismatch based on the modified netlist. In one embodiment, the extracting of a mismatch model includes selecting a set of model parameters, generating a distribution of mismatch values for each of the model parameters, extracting a set of linking coefficients based on the mismatch values, and extracting a mismatch model based on the set of linking coefficients. In another embodiment, the attaching of the mismatch model to the netlist includes determining a number of layers in the netlist, generating a copy of a lower layer in the netlist, where the copy of the lower layer includes a reference to a mismatch model definition, generating a copy of a higher layer in the netlist, replacing a reference to the lower layer in the higher layer by a reference to the copy of the lower layer, and generating a new model definition. In an exemplary embodiment, the lower layer includes a device specification instance and the higher layer includes a sub-circuit specification instance. In an exemplary embodiment, a layer can be referred to as a sub-circuit layer if it contains a reference to a sub-circuit.

An exemplary method for extracting mismatch values that are used to simulate the effect of mismatch in design flows comprises: receiving measured data, receiving an original model, selecting a set of model parameters, generating a distribution of mismatch values for each of the model parameters based on the measure data and the original model, extracting a set of linking coefficients based on the mismatch values, and extracting the mismatch model based on the set of linking coefficients. In one embodiment, selecting a set of model parameters includes adding a value to a model parameter, performing a device performance simulation based on the model parameter, repeating the adding and performing for all model parameters, ranking the model parameters based on the device performance simulation, and selecting a set of model parameters based on the ranking. In another embodiment, instead of performing device simulations, sub-circuit simulations are performed.

In another embodiment, generating a distribution of mismatch values includes generating a number of target values, performing a set of simulations for each of the model parameters based on the target values, and generating a distribution of mismatch values for each of the model parameters based on the simulations. In an exemplary embodiment, the method further comprises generating correlation distributions among the set of model parameters based on the mismatch values.

Another exemplary method for simulating the effect of mismatch in design flows based on a mismatch model file, including a set of linking coefficients, and netlist information from a netlist comprises: extracting a set of modified model parameters based on the mismatch model file and the netlist information, attaching the set of modified model parameters to the netlist to obtain a modified netlist, simulating the netlist, and outputting results based on the simulation. In one embodiment, extracting a set of modified model parameters includes receiving a target type and a mismatch amount, determining a set of bias conditions, and fitting the target type and the mismatch amount under the bias conditions based on the mismatch model file and the netlist information. In an exemplary embodiment, determining a set of bias conditions includes commenting out an original analysis operation, performing an operating point analysis, and restoring the original analysis operation. In another embodiment, extracting a set of modified model parameters includes receiving a user selection to simulate individual devices, assigning a dummy device to each individual device, simulating the individual device and the dummy device, and generating the modified model parameters based on the simulating and the set of linking coefficients. In yet another embodiment, extracting a set of modified model parameters includes receiving a user selection to simulate device in pairs, simulating the pairs, and generating the modified model parameters based on the simulating and the set of linking coefficients.

An exemplary computer program product for simulating the effect of mismatch in design flows comprises logic code for receiving measured data, logic code for receiving an original model, logic code for extracting a mismatch model based on the measured data and the original model, logic code for attaching the mismatch model to a netlist to obtain a modified netlist, and logic code for simulating an effect of mismatch based on the modified netlist. In one embodiment, the logic code for extracting a mismatch model includes logic code for selecting a set of model parameters, logic code for generating a distribution of mismatch values for each of the model parameters, logic code for extracting a set of linking coefficients based on the mismatch values, and logic code for extracting the mismatch model based on the set of linking coefficients.

In one embodiment, the logic code for attaching the mismatch model to a netlist includes logic code for determining a number of layers in the netlist, logic code for generating a copy of a lower layer in the netlist, where the copy of the lower layer includes a reference to a mismatch model definition, logic code for generating a copy of a higher layer in the netlist, logic code for replacing a reference to the lower layer in the higher layer by a reference to the copy of the lower layer, and logic code for generating a new model definition. In an exemplary embodiment, the lower layer includes a device specification instance and the higher layer includes a sub-circuit specification instance.

Another exemplary computer program product for simulating the effect of mismatch in design flows comprises logic code for receiving measured data, logic code for receiving an original model, logic code for selecting a set of model parameters, logic code for generating a distribution of mismatch values for each of the model parameters based on the measure data and the original model, logic code for extracting a set of linking coefficients based on the mismatch values, and logic code for extracting the mismatch model based on the set of linking coefficients. In one embodiment, the logic code for generating a distribution of mismatch values includes logic code for generating a number of target values, logic code for performing a set of simulations for each of the model parameters based on the target values, and logic code for generating a distribution of mismatch values for each of the model parameters based on the simulations. In an exemplary embodiment, the exemplary computer program product further comprises logic code for generating correlations among the set of model parameters based on the mismatch values.

Another exemplary computer program product for simulating the effect of mismatch in design flows based on a mismatch model file, including a set of linking coefficients, and netlist information from a netlist comprises: logic code for extracting a set of modified model parameters based on the mismatch model file and the netlist information, logic code for attaching the set of modified model parameters to the netlist to obtain a modified netlist, logic code for simulating the netlist, and logic code for outputting results based on the simulation. In one embodiment, the logic code for extracting a set of modified model parameters includes logic code for receiving a target type and a mismatch amount, logic code for determining a set of bias conditions, and logic code for fitting the target type and the mismatch amount under the bias conditions based on the mismatch model file and the netlist information. In another embodiment, the logic code for determining a set of bias conditions includes logic code for commenting out an original analysis operation, logic code for performing an operating point analysis, and logic code for restoring the original analysis operation.

In another embodiment, the logic code for extracting a set of modified model parameters includes logic code for receiving a user selection to simulate individual devices, logic code for assigning a dummy device to each individual device, logic code for simulating the individual device and the dummy device, and logic code for generating the modified model parameters based on the simulating and the set of linking coefficients. In yet another embodiment, the logic code for extracting a set of modified model parameters includes logic code for receiving a user selection to simulate device in pairs, logic code for simulating the pairs, and logic code for generating the modified model parameters based on the simulating and the set of linking coefficients.

An exemplary apparatus for simulating the effect of mismatch in design flows comprises a modeling tool and a simulation tool. The modeling tool extracts a mismatch model based on measured data received from test wafers and an original model from a user. The simulation tool attaches the mismatch model to a netlist to obtain a modified netlist and simulates an effect of mismatch based on the modified netlist. In an exemplary embodiment, the modeling tool comprises a first module for selecting a set of model parameters and a second module for generating a distribution of mismatch values for each of the model parameters.

An exemplary apparatus for extracting mismatch values that are used to simulate the effect of mismatch in design flows comprises an input interface, a mismatch extraction module, and an output interface. The input interface receives measured data from test wafers and an original model from a user. In an exemplary embodiment, the mismatch extraction module selects a set of model parameters and generates a distribution of mismatch values for each of the model parameters based on the measure data and the original model, extracts a set of linking coefficients based on the mismatch values, and extracts the mismatch model based on the set of linking coefficients. In one embodiment, the exemplary apparatus further comprises a mismatch value verification module for comparing extracted mismatch values to simulation results.

In an exemplary embodiment, the mismatch extraction module further comprises a parameter selection sub-module for adding a value to a model parameter, performing a device performance simulation based on the model parameter, repeating the adding and performing for all model parameters, ranking the model parameters based on the device performance simulation, and selecting a set of model parameters based on the ranking. In another embodiment, instead of performing device simulations, sub-circuit simulations are performed. In another exemplary embodiment, the mismatch extraction module further comprises a mismatch value extraction sub-module for generating a number of target values, performing a set of simulations for each of the model parameters based on the target values, and generating a distribution of mismatch values for each of the model parameters based on the simulations. In yet another exemplary embodiment, the exemplary apparatus further comprises a correlation extraction sub-module for generating correlations among the set of model parameters based on the mismatch values.

Another exemplary apparatus for simulating the effect of mismatch in design flows based on a mismatch model file, including a set of linking coefficients, and netlist information from a netlist comprises an input interface, a simulator, and an output interface. In an exemplary embodiment, the simulator extracts a set of modified model parameters based on the mismatch model file and the netlist information received through the input interface, attaches the set of modified model parameters to the netlist to obtain a modified netlist, and simulates the modified netlist. The output interface outputs results of the simulation performed by the simulator.

DETAILED DESCRIPTION OF THE INVENTION

Figure 1A:
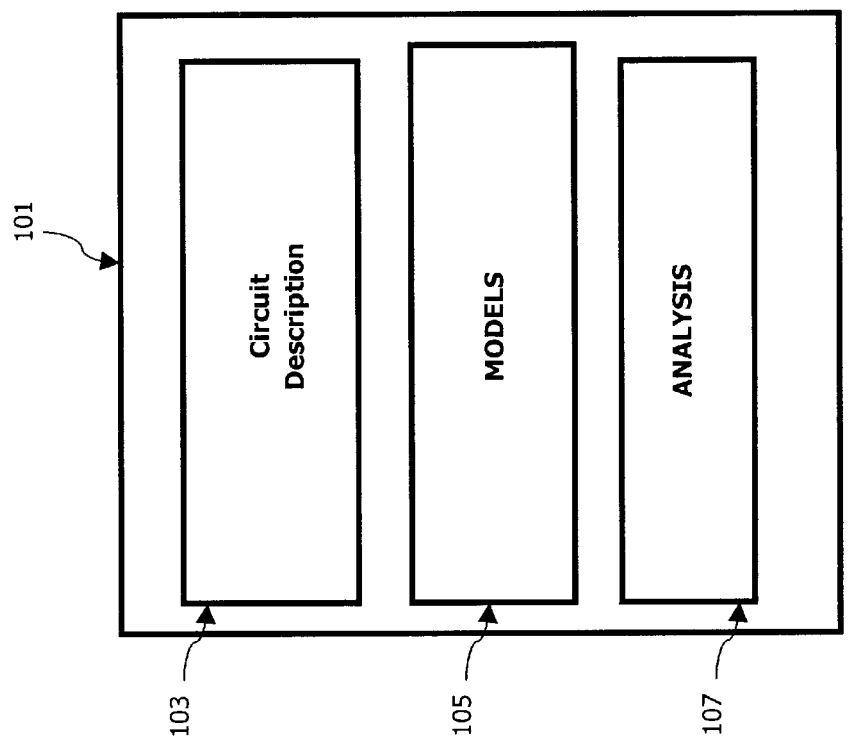
FIG. 1A schematically illustrates a netlist in accordance with prior art.
Figure 1B:
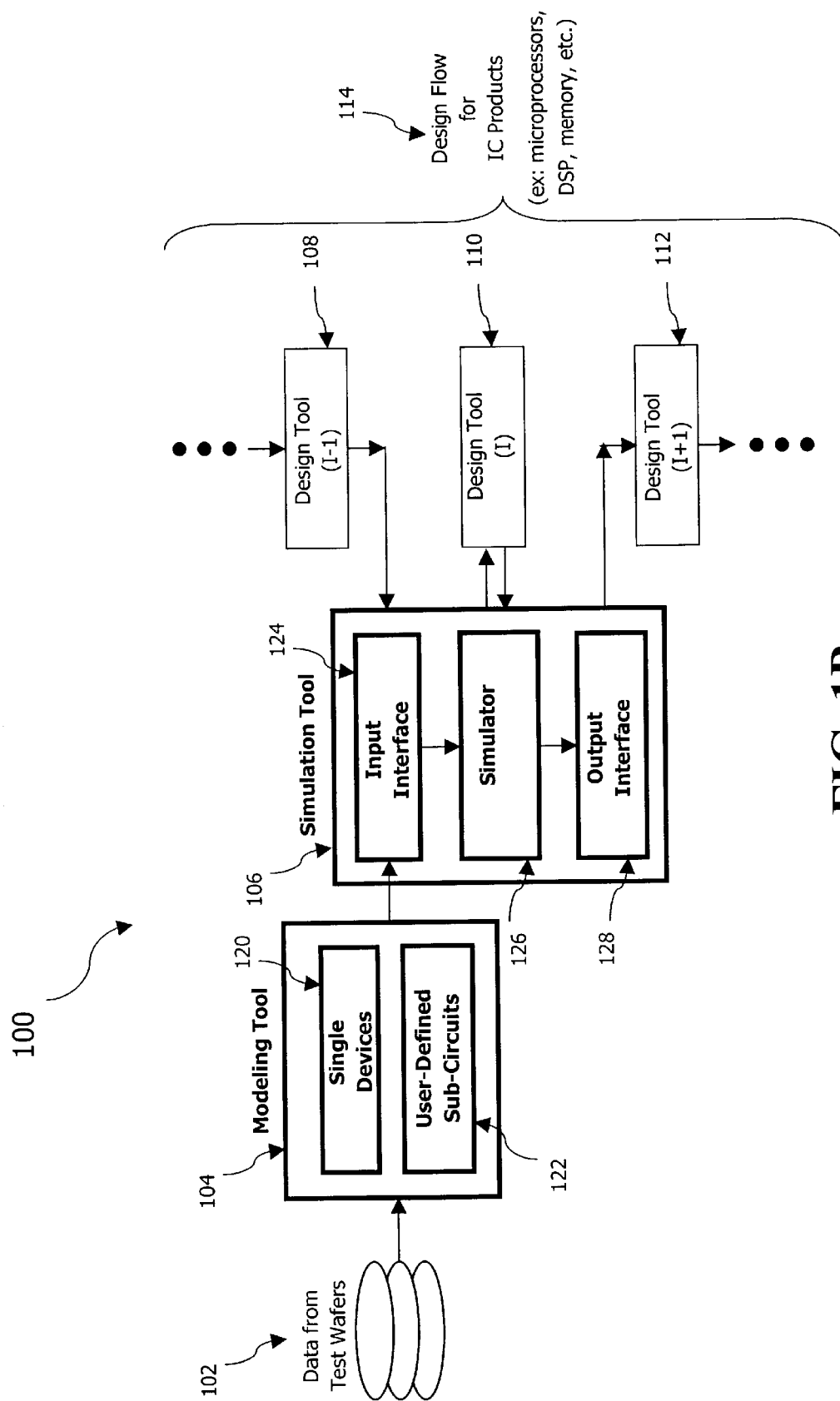
FIG. 1B schematically illustrates an exemplary system in accordance with an embodiment of the invention.

FIG. 1B schematically illustrates an exemplary system 100 in accordance with an embodiment of the invention. The system 100 includes test wafers 102, a modeling tool 104, a simulation tool 106, and multiple design tools, 108, 110, and 112, in a design flow 114. The modeling tool includes a single device processing unit 120 and a user-defined sub-circuit processing unit 122. The simulation tool 106 includes an input interface 124, a simulator 126, and an output interface 128.

In the system 100, data collected from the test wafers 102 is inputted into the modeling tool 120. The modeling tool 120 is configured to process data collected from single devices in the single device processing unit 120 or from user-defined sub-circuits in the sub-circuit processing unit 122. Because the basic processing of data from a single device or a sub-circuit is the same, for ease of explanation, only the processing of a single device in the modeling tool 104 is described.

The system 100 simulates the effect of mismatch in the design flow 114 by receiving netlist information from a netlist 101, selecting a set of model parameters based on the netlist information, calculating mismatch values for the set of model parameters, adding the mismatch values to the set of model parameters to obtain a set of modified model parameters, generating a new model based on the modified model parameters, attaching the new model back into the netlist 101, and simulating the circuit. In an exemplary embodiment, the modeling tool 104 calculates the mismatch values based on measured data received from the test wafers 102 and an original model from a user and provides a set of linking coefficients (or mismatch model parameters) to the simulation tool 106. The simulation tool 106 generates a set of modified model parameters based on the set of linking coefficients and information from a netlist, attaches the set of modified model parameters back into the netlist, and simulates the effect of mismatch in the design flow 114.

In an exemplary embodiment, the set of linking coefficients (mismatch model parameters) is sent from the modeling tool 104 to the simulation tool 106 through the input interface 124. The simulation tool 106 simulates the effect of mismatch in the simulator 126. Simulation results are outputted onto the design flow 114 through the output interface 128.

Figure 2:
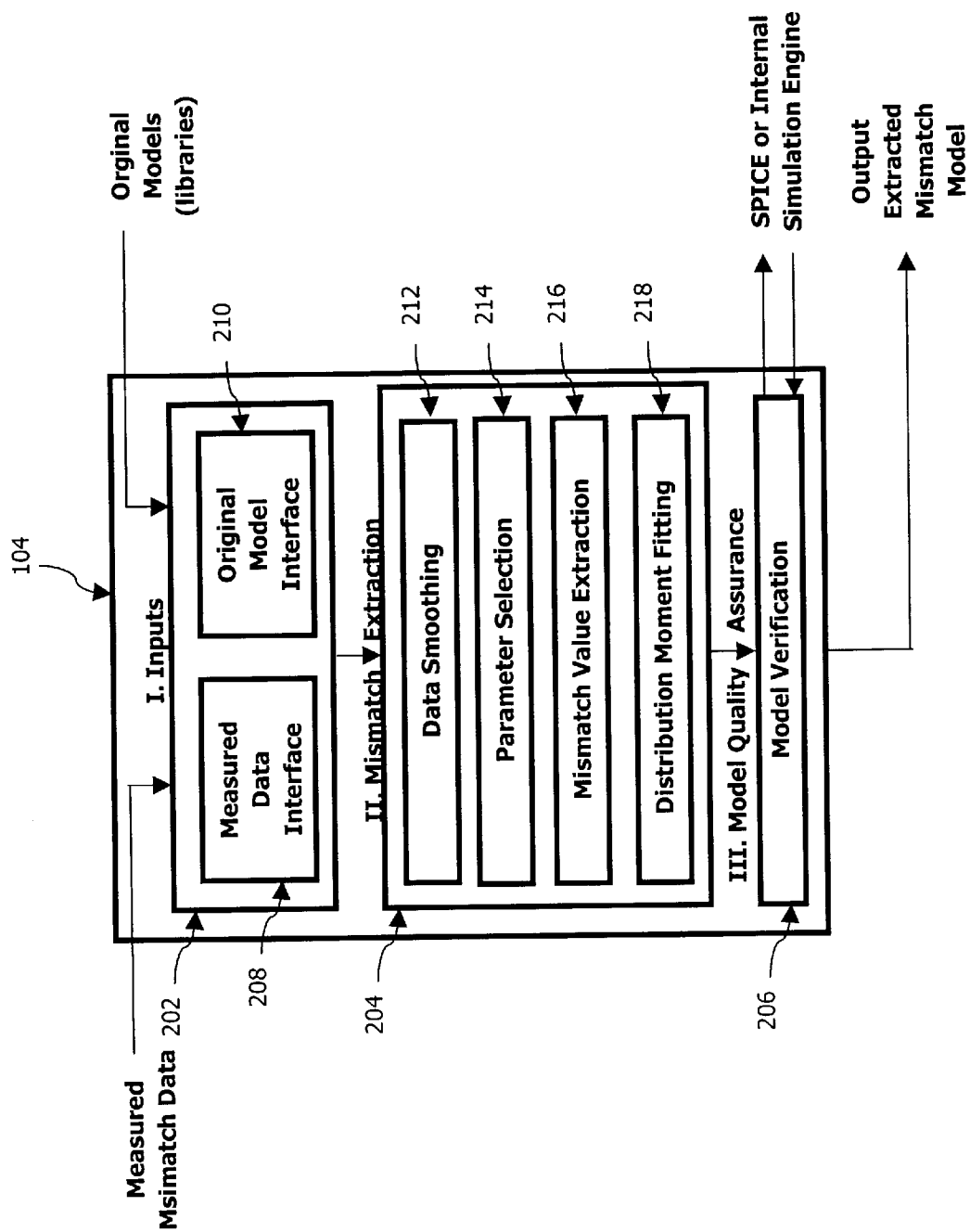
FIG. 2 schematically illustrates an exemplary model tool in accordance with an embodiment of the invention.

FIG. 2 schematically illustrates an exemplary modeling tool 104 in accordance with an embodiment of the invention. The modeling tool 104 includes input interfaces 202, a mismatch extraction module 204, and a model quality assurance module 206. The input interfaces 202 include a measured data interface 208 and an original model interface 210. The measured data interface 208 receives measured data from the test wafers 102 (see FIG. 1). The original model interface 210 receives an original model (i.e., model equations and model parameters) from a user.

The mismatch extraction module 204 includes a data smoothing sub-module 212, a parameter selection sub-module 214, a mismatch value extraction sub-module 216, and a distribution moment fitting sub-module 218. The data smoothing sub-module 212 smooths measured mismatch data. The parameter selection sub-module 214 selects a subset of model parameters from a set of model parameters received from the models section 105 of the netlist 101. In an exemplary embodiment, the mismatch value extraction sub-module extracts a distribution of mismatch values for each model parameter in the subset of selected model parameters. In an exemplary embodiment, distributions of mismatch values for each layout, distance, geometry, in all bias conditions are extracted. In another exemplary embodiment, correlations between such extracted distributions of mismatch values are also extracted. In an exemplary embodiment, the distribution moment fitting sub-module 218 generates moments for such distributions of mismatch values. These moments and correlations are linked by determining a set of linking coefficients. These linking coefficients are also referred to as mismatch model parameters. In other words, the distributions of mismatch values are a calculable as a function of linking coefficients (or mismatch model parameters). During simulation, the distributions of mismatch values are added to the subset of model parameters, which becomes a set of modified model parameters.

The model quality assurance sub-module 206 compares results generated by the mismatch value extraction sub-module 216 to measured data from the test wafers 102. For example, an external design tool, such as SPICE, is called to simulate all devices using the modified model parameters. The simulation results are compared to the measured data. If the fitting of the simulation results and measured data is good, then the quality of the extracted mismatch model parameters is assured. After quality assurance, the extracted linking coefficients (mismatch model parameters) for generating distributions of mismatch values and correlations, are outputted to the simulation tool 106.

Figure 3A:
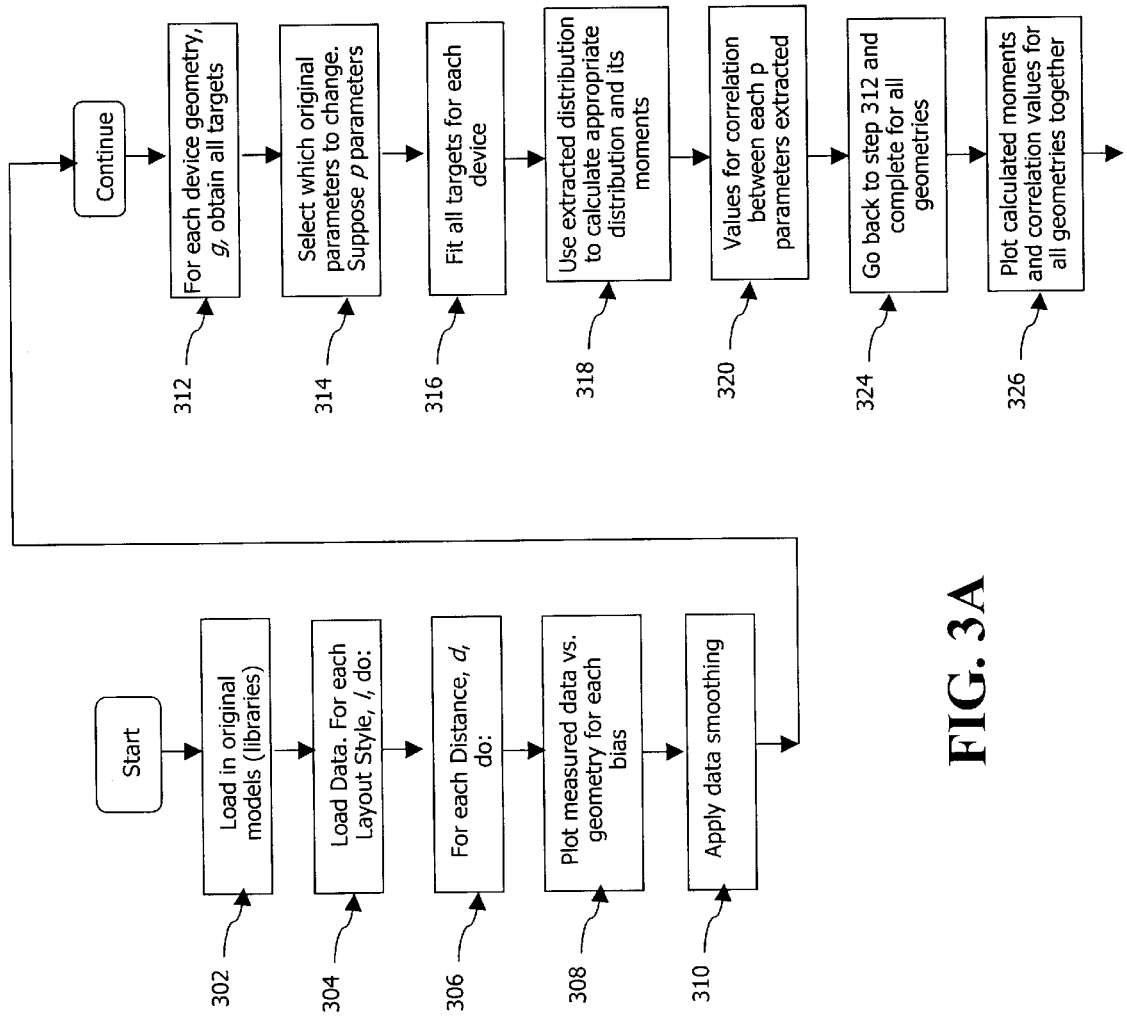
FIGS. 3A and 3B illustrate an exemplary process in accordance with an embodiment of the invention.
Figure 3B:
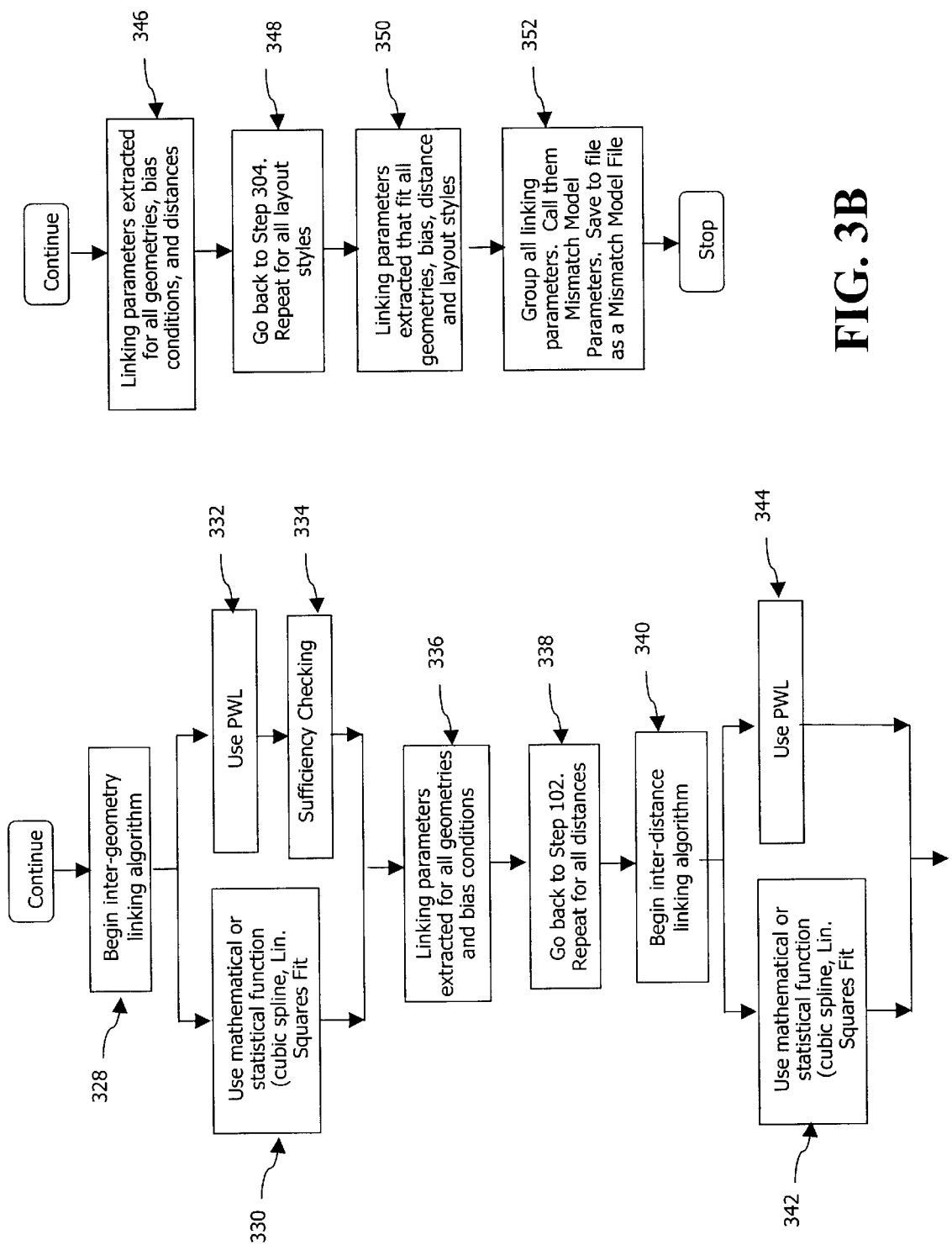

FIGS. 3A and 3B illustrate an exemplary process performed by the modeling tool 104 in accordance with an embodiment of the invention. In FIG. 3A, an original model, including model equations and model parameters, is loaded into the modeling tool 104 (step 302). Next, measured data from test wafers is loaded into the modeling tool 104 (step 304). Typically, the measured data comprises various output values under different bias conditions, such as output currents (Ids), threshold voltages (Vth), or gain values (Gm), for difference device geometries. In an exemplary embodiment, each device geometry can be arranged in various layout styles, such as parallel pair layout style or cross-coupled layout style. Each layout style also includes devices separated by different distances. The effect of mismatch for a device is dependent on many factors, including, without limitation, device geometry, distance between devices, layout style, bias conditions applied, temperature applied, and other factors.

In an exemplary embodiment, for a first distance within a first layout style (step 306), measured data is plotted against device geometry under each bias condition (step 308). In an exemplary embodiment, the plotted data is optionally smoothed by data smoothing techniques known in the art (step 310). Next, for each device geometry, "g", all targets (measured data) are obtained (step 312).

Next, a subset of model parameters is selected (step 314). In an exemplary embodiment, a distribution of mismatch values for each model parameter in the subset is extracted to account for the effect of mismatch. In an exemplary embodiment, the subset of model parameters is selected by one of two ways: automatic or manual selection. In one embodiment, a subset of model parameters is automatically selected by the modeling tool 104; an exemplary process to make an automatic selection is described in FIG. 4 below. In another embodiment, a user manually selects a subset of model parameters. After a subset of model parameters has been selected, all targets obtained is fitted for each geometry (step 316). In an exemplary embodiment, a user is prompted to enter a maximum number (n). In one embodiment, the maximum number is provided to a random number generator to generate n values for each target (obtained at step 312) of a given geometry (e.g., n Ids current values). A device having the geometry has a model equation that simulates the behavior of the device. In the first iteration, the modeling tool 104 uses the measured or smoothed data values and performs n simulations for each target. These simulated n values for each target will be fitted through the extraction of linking coefficients (mismatch model parameters).

In an exemplary embodiment, a device's behavior is predictable by an assigned model equation having multiple model parameters. The device's model equation and model parameters can be obtained from the netlist 101. At step 314 in FIG. 3, a subset of model parameters for each device has been selected, whereby distributions of mismatch values are to be extracted to account for the effect of mismatch. Thus, during the first n simulations of a device having a first geometry, a distribution of mismatch values for a selected model parameter is extracted based on a difference in a simulated device performance compared to measured data. The goal during subsequent sets of n simulations is to minimize this difference. This is achieved by changing the selected model parameters. Thus, at the last set of n simulations of a device, a distribution of mismatch values for that model parameter is obtained. The simulations are repeated for each selected model parameter. For a device having a first geometry, at the end of simulations for all of the selected model parameters, the simulation results for each selected model parameter are used to calculate appropriate distribution and moments (step 318). For example, if a distribution of mismatch values for a model parameter is a normal distribution, then two moments are calculated (e.g., mean and sigma values). However, if a different distribution is obtained the number of moments can be different. Moment extraction for different distribution types is well known in the art. If multiple model parameters are selected, correlations of mismatch values between selected model parameters are also extracted (step 320).

Next, the process repeats from step 312 to obtain the same information for all geometries separated by the first distance in the first layout (step 324). When all geometries separated by the first distance in the first layout have been processed, the calculated moments and correlation values versus all geometries (e.g., sigma versus device geometry) are plotted for each target type (step 326). The process in FIG. 3A continues in FIG. 3B. At step 328, inter-geometry linking is performed by one of two ways: an application of mathematical functions or by a piece-wise-linear method (PWL). In one embodiment, at least one mathematical or statistical function known in the art (e.g., cubic spline, linear squares fit, etc.) is used to link data points plotted at step 326 (step 330). Mathematical or statistical functions are typically applied when all of the data points to be linked form a definable slope or are linearly positioned. In another embodiment, the PWL method is used (step 332). The PWL method connects data points from point to point. Thus, the PWL method can be used to connect any data points whether or not they form a definable slope or are linearly positioned. If the PWL method is used, a sufficiency checking is performed (step 334). An exemplary process for the PWL method and the sufficiency checking is provided in FIG. 5 below. At step 336, for each selected model parameter, a set of linking coefficients (mismatch model parameters) for all geometries and bias conditions have been extracted for the first distance within the first layout style.

At step 338, the process repeats from step 306 to generate the same data as described above for all distances within the first layout. After data has been generated for all distances within the first layout, inter-distance linking is performed (step 340). In an exemplary embodiment, the inter-distance linking is performed by one of two ways: an application of at least one mathematical or statistical functions (step 342), or by a PWL method (step 344). At step 346, for each selected model parameter, a set of linking coefficients (mismatch model parameters) for all geometries, bias conditions, and distances for the first layout is extracted. Next, the process repeats from step 304 to generate the same data as described above for all layout styles (step 348). At step 350, for each selected model parameters, a set of linking coefficients (mismatch model parameters) for all geometries, bias conditions, distances, and layout styles is extracted. All linking coefficients are stored in a mismatch model file.

Figure 4:
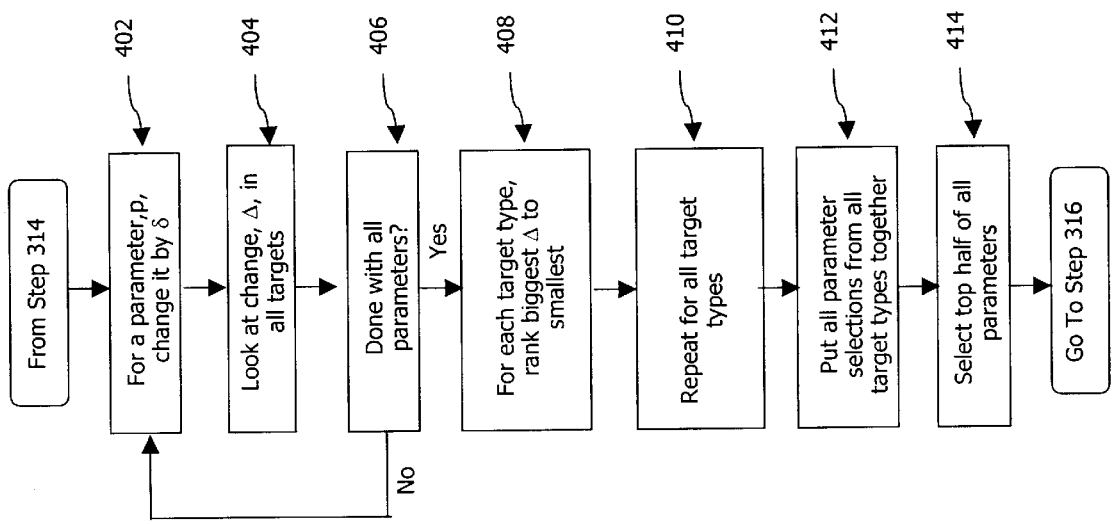
FIG. 4 illustrates an exemplary process in accordance with an embodiment of the invention.

FIG. 4 illustrates an exemplary process of step 314 in accordance with an embodiment of the invention. A model parameter value of a device is changed by a randomly generated value, δ, while all other model parameter values of the device maintains their original values (step 402). Next, the device is simulated and any changes in device performance, or Δ, for all target types are recorded (step 404). Perform steps 402 and 404 for each model parameter of the device (step 406). For each target type, rank the Δs from the largest value to the smallest value (step 408). Repeat step 408 for all target types (step 410). Rank all model parameters in accordance with resulting Δs of all target types (step 412). In an exemplary embodiment, select the top half of the ranked model parameters (step 414). In another embodiment, a user may select as many as he/she desires. Generally, a change in a higher ranking model parameter has a greater effect on the overall performance of the device than a change in a lower ranking model parameter.

Figures 5A, 5B:
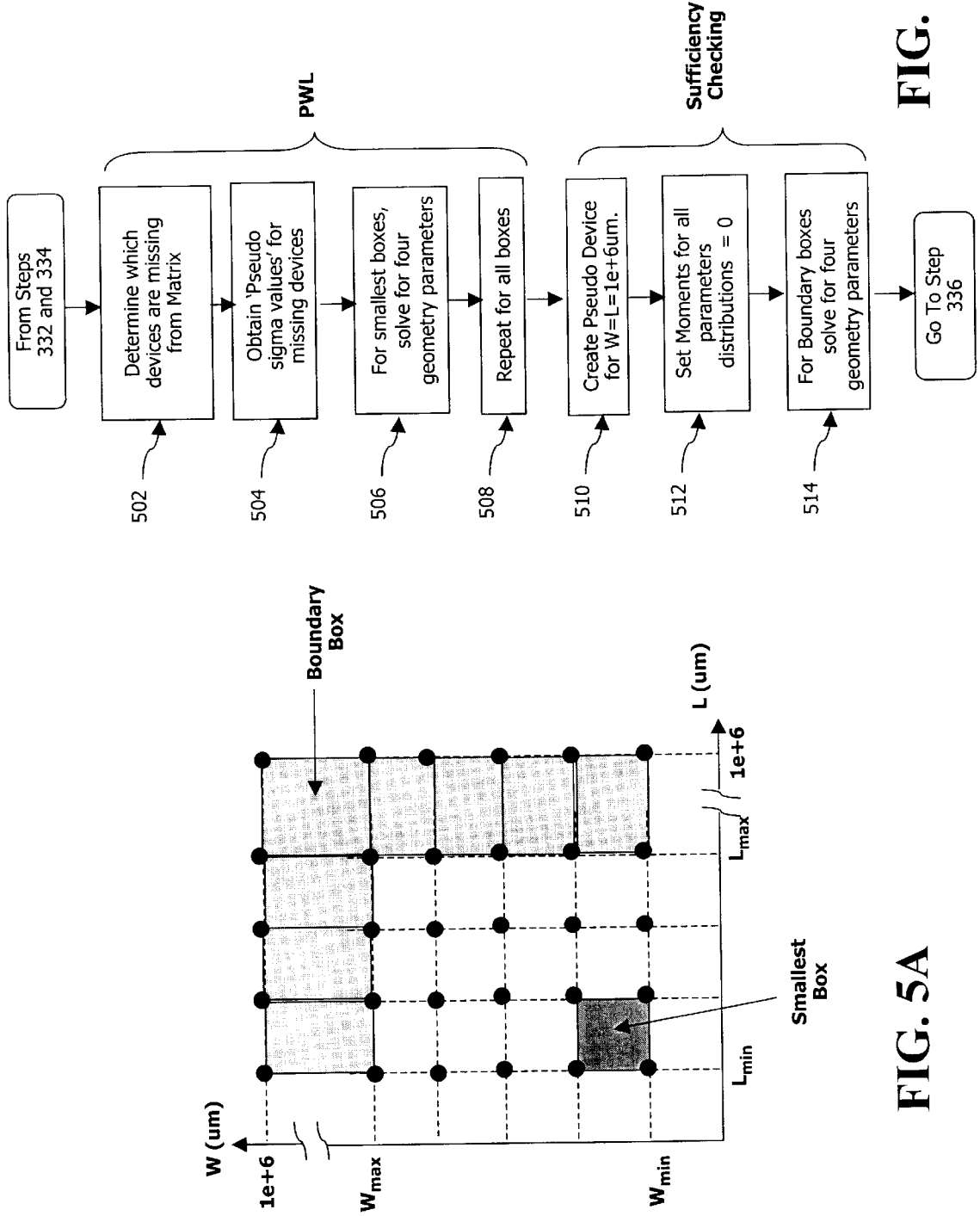
FIGS. 5A and 5B illustrate an exemplary process in accordance with an embodiment of the invention.

FIGS. 5A and 5B illustrate an exemplary process of steps 332 and 334 in accordance with an embodiment of the invention. In FIG. 5B, for every two data points to be connected, missing device geometries are determined (step 502). For example, if the first data point has a first sigma value at a device geometry of $W_0L_0$ and the second data point has a second sigma value at a device geometry of $W_1L_1$, then the missing device geometries are $W_0L_1$ and $W_1L_0$, where L is the length of the device and W is the width of the device. Next, pseudo sigma values are obtained for the missing device geometries (step 504). In an exemplary embodiment, pseudo sigma values are obtained by plugging the missing device geometries back into the plot generated in step 326 (See the FIG. 5A to the left). For the closest two data points, or smallest boxes, solve for four geometry parameters (step 506). Repeat step 506 for all data points (step 508). Create pseudo devices for the boundary data points, for example, W=L=1e+6um (step 510). For these pseudo devices, set all moments for the selected model parameters to zero. Set all sigma values of all geometry parameters to zero (step 512). For boundary boxes, solve for four geometry parameters.

FIGS. 2 to 5 illustrate exemplary embodiments to extract linking coefficients (mismatch model parameters) for each selected model parameter of individual devices. A sub-circuit is processed as an individual device when extracting linking coefficients for the sub-circuit. In other words, the model parameters for individual devices within a sub-circuit are combined and treated as one set of model parameters in an original model received by the original model interface 210.

Figure 6:
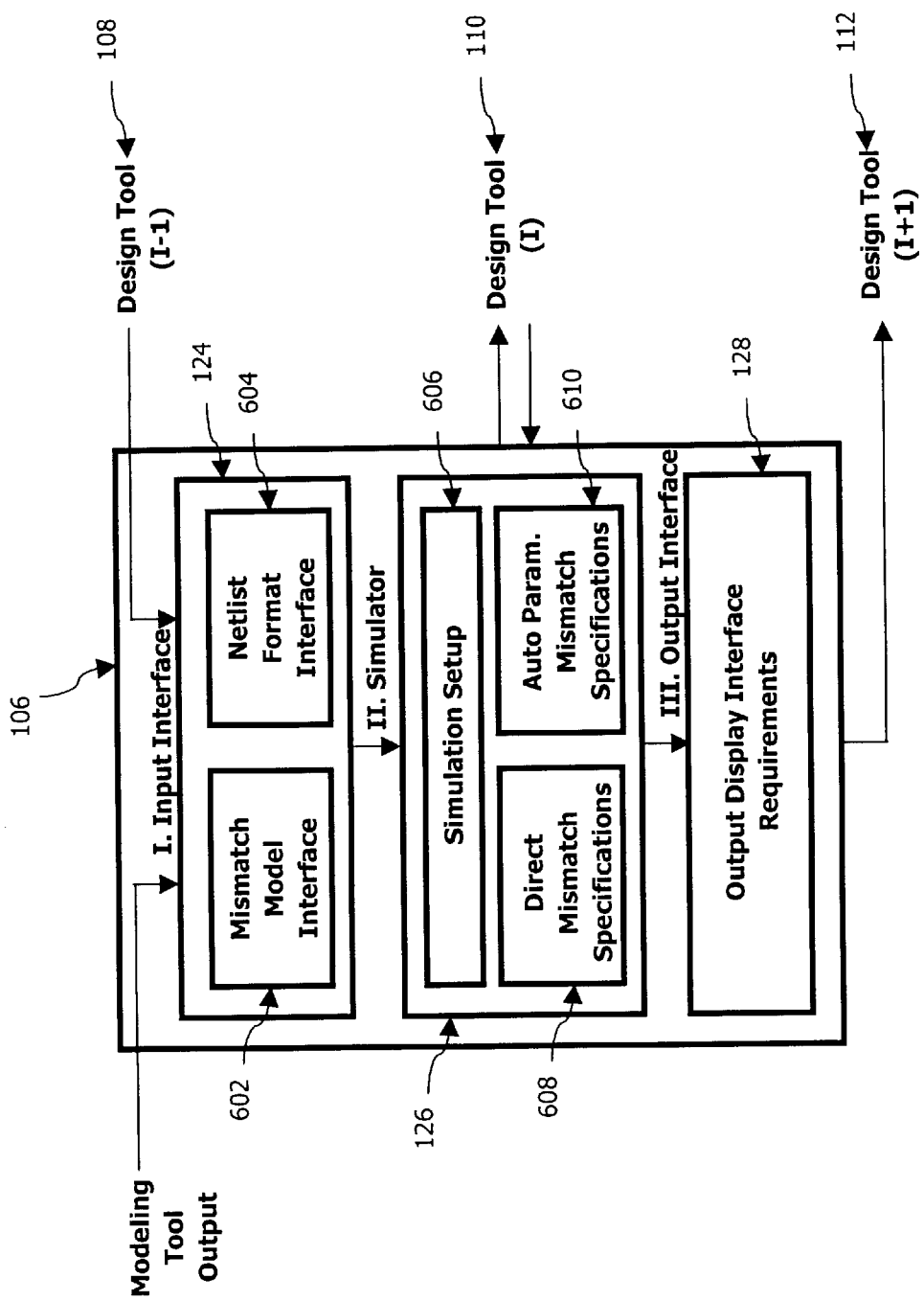
FIG. 6 schematically illustrates an exemplary simulation tool in accordance with an embodiment of the invention.

FIG. 6 schematically illustrates an exemplary simulation tool 106 in accordance with an embodiment of the invention. The simulation tool 106 includes the input interface 124, the simulator 126, and the output interface 128. The input interface 124 includes a mismatch model interface 602, and a netlist format interface 604. The simulator 126 includes a simulation setup module 606, a direct mismatch specifications module 608, and an automatic parameter mismatch specifications module 610. The output interface 128 includes output display instructions.

In an exemplary embodiment, the mismatch model interface 602 receives a mismatch model file from the modeling tool 104. The mismatch model interface 602 is configured to process model information from any modeling tool containing model parameters having mismatch values that account for the mismatch dependence on device geometry, distances, temperature, layout style, and/or other factors. In addition, the modeling tool should preferably provide correlation information between mismatch values. Preferably, a modeling tool should provide at least one mismatch value to account for the effect of mismatch.

In an exemplary embodiment, the netlist format interface 604 receives netlist information from the netlist 101. The netlist format interface 604 stores netlist information in appropriate databases within the simulation tool 106. In an exemplary embodiment, netlist information complies with rules, such as device instance specification rules (i.e., a line-by-line description of each device and device interconnections), sub-circuit specification rules (i.e., a description of components within a sub-circuit and sub-circuit/device interconnections), model specification rules (i.e., a list of model parameters and model equations for each device), analysis specification rules (i.e., instructions to analyze received data, for example, transient or frequency analysis), and/or output specification rules (i.e., instructions to display analysis results). Preferably, netlist information should comply with at least the device instance specification rules.

The simulation setup module 606 sets up received data for performance simulations. In an exemplary embodiment, simulations can be performed by the direct mismatch specifications module 608 or the automatic parameter mismatch specifications module 610. The direct mismatch specifications module 608 automatically selects and modifies appropriate model parameters to perform simulations based on a user specified target value and mismatch amount. In the automatic parameter specifications module 610, simulations are performed automatically using the Monte Carlo simulation method without receiving user input of target type or mismatch amount.

Figure 7:
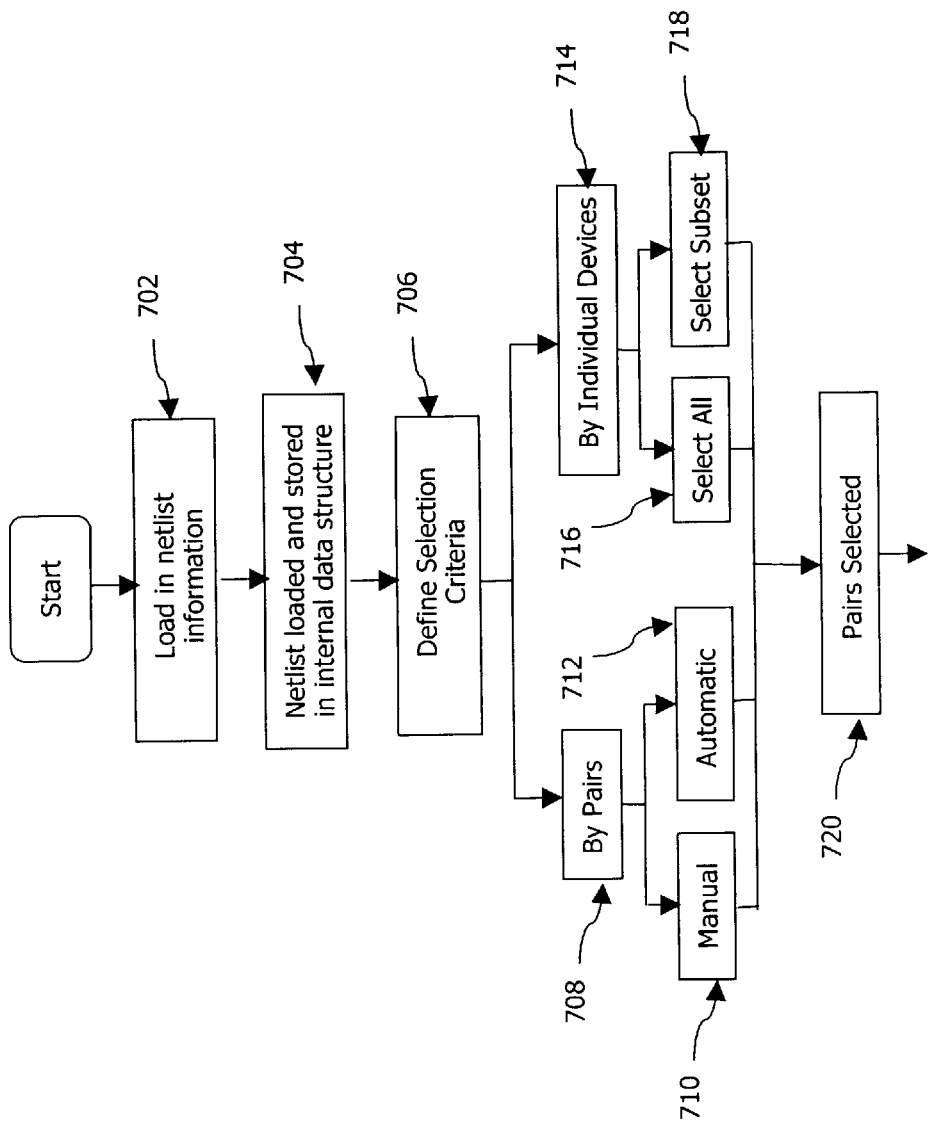
FIG. 7 illustrates an exemplary process in accordance with an embodiment of the invention.

FIG. 7 illustrates an exemplary set up process in accordance with an embodiment of the invention. At step 702, netlist information is loaded into the simulator 126. The netlist information is parsed and stored into internal databases (step 704). A user is prompted to define device selection criteria (step 706). In an exemplary embodiment, the user may choose to simulate device performance by pairs (step 708). That is, a device is designated as a reference device and another device is compared to the reference device during simulation. In one embodiment, pairs of devices to be simulated are manually selected by the user (e.g., by clicking on a computer screen with a mouse) (step 710). In another embodiment, pairs of devices to be simulated are automatically selected by the simulator 126 based on internal policy (step 712). In another exemplary embodiment, the user may choose to simulate in individual devices (step 714). In this embodiment, the user can further elect to simulate every device in the netlist 101 (step 716) or to simulate a subset of all the devices in the netlist 101 (step 718). Further, in this embodiment, a dummy device is assigned as a reference device for each device selected by the user to be simulated. In this way, devices appear to be independently varying to a user yet, at the same time, conform to mismatch definition of relative change. Selected pairs (from step 708) or pairs comprising dummy devices and selected individual devices (from step 714) are outputted to the direct mismatch specifications module 608 or the automatic parameter mismatch specifications module 610 (step 720).

Figure 8:
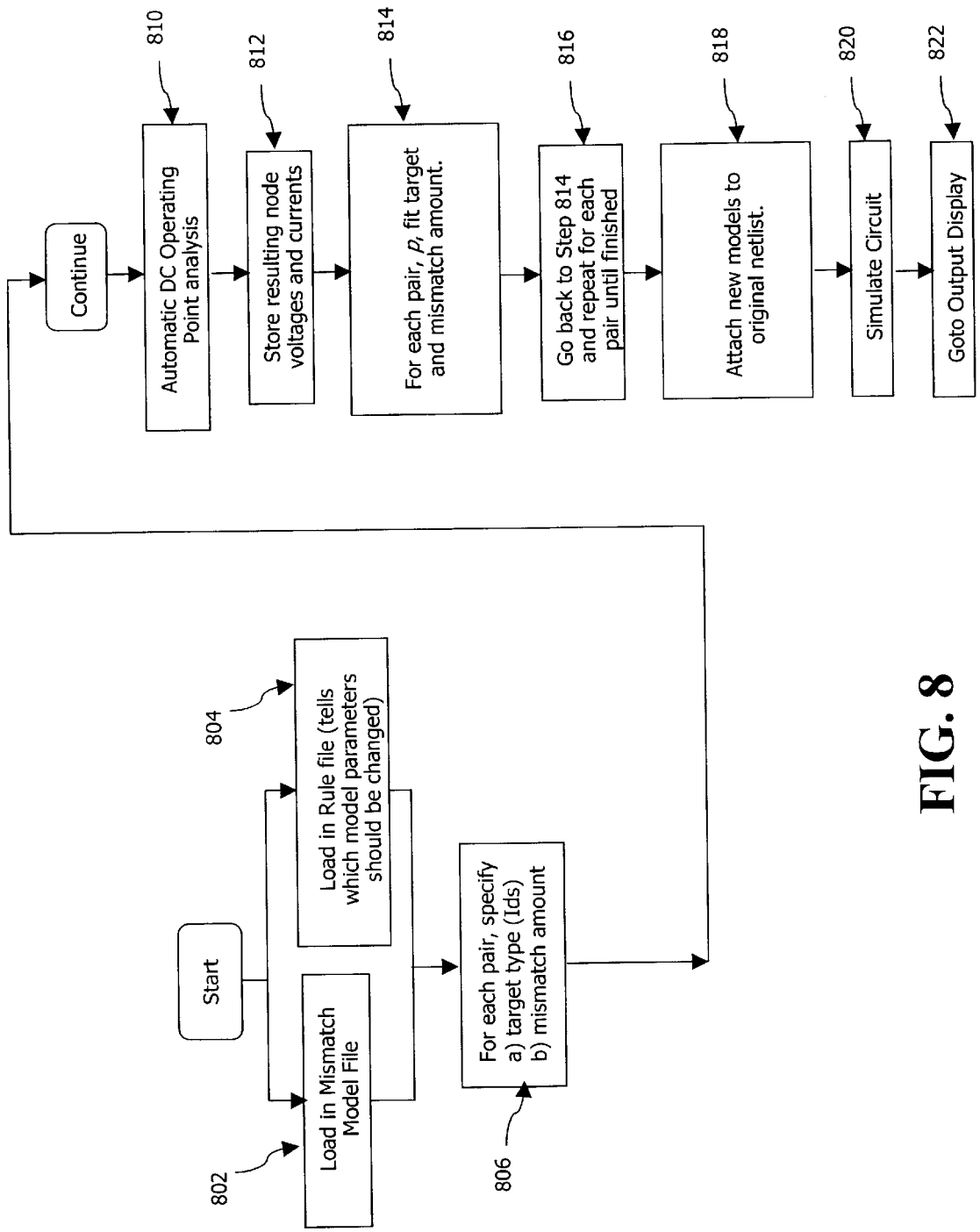
FIG. 8 illustrates an exemplary process in accordance with an embodiment of the invention.

FIG. 8 illustrates an exemplary process performed by the direct mismatch specifications module 608 in accordance with an embodiment of the invention. A mismatch model file created by the mismatch model interface 602 is loaded into the simulator 126 (step 802). If there is no mismatch model file, a default rule file is loaded instead (step 804). In an exemplary embodiment, a user can select a default rule file even if a mismatch model file was created. If the default rule file is loaded, the direct mismatch specifications module 608 is authorized to select model parameters and generate mismatch values to add to those model parameters to simulate the effect of mismatch. For each pair of devices, a user is prompted to specify a target type (including a target value) and a mismatch amount (step 806). An automatic direct current operating point analysis is performed to determine bias conditions (e.g., node voltages, node currents) under which the designated mismatch amount results (step 810). In an exemplary embodiment, the operating point analysis is performed by automatically commenting out and temporarily replacing original analysis operations (e.g., .DC, .Tran, or .AC) by the operating point analysis (e.g., .OP). The original analysis operations are restored after the operating point analysis is completed. The resulting bias conditions from the operating point analysis are stored in the simulator 126 (step 812).

For each pair of devices, the user's inputted target type and mismatch amount are fitted. That is, mismatch values that comply with the specified target type and mismatch amount for each pair of devices are automatically extracted and added to a set of selected model parameters to obtain modified model parameters (step 814). An exemplary process of step 814 is provided in FIG. 9 below. Step 814 is repeated for each pair of devices selected at step 720 (step 816).

After each pair of devices has been processed, all modified model parameters are attached to the original netlist 101 (step 818). An exemplary process of step 818 is provided in FIG. 10 below. Next, the circuit is simulated in the simulator 126 using the new model (step 820). Simulation results are displayed to the user based on instructions in the output interface 128 (step 822).

Figure 9:
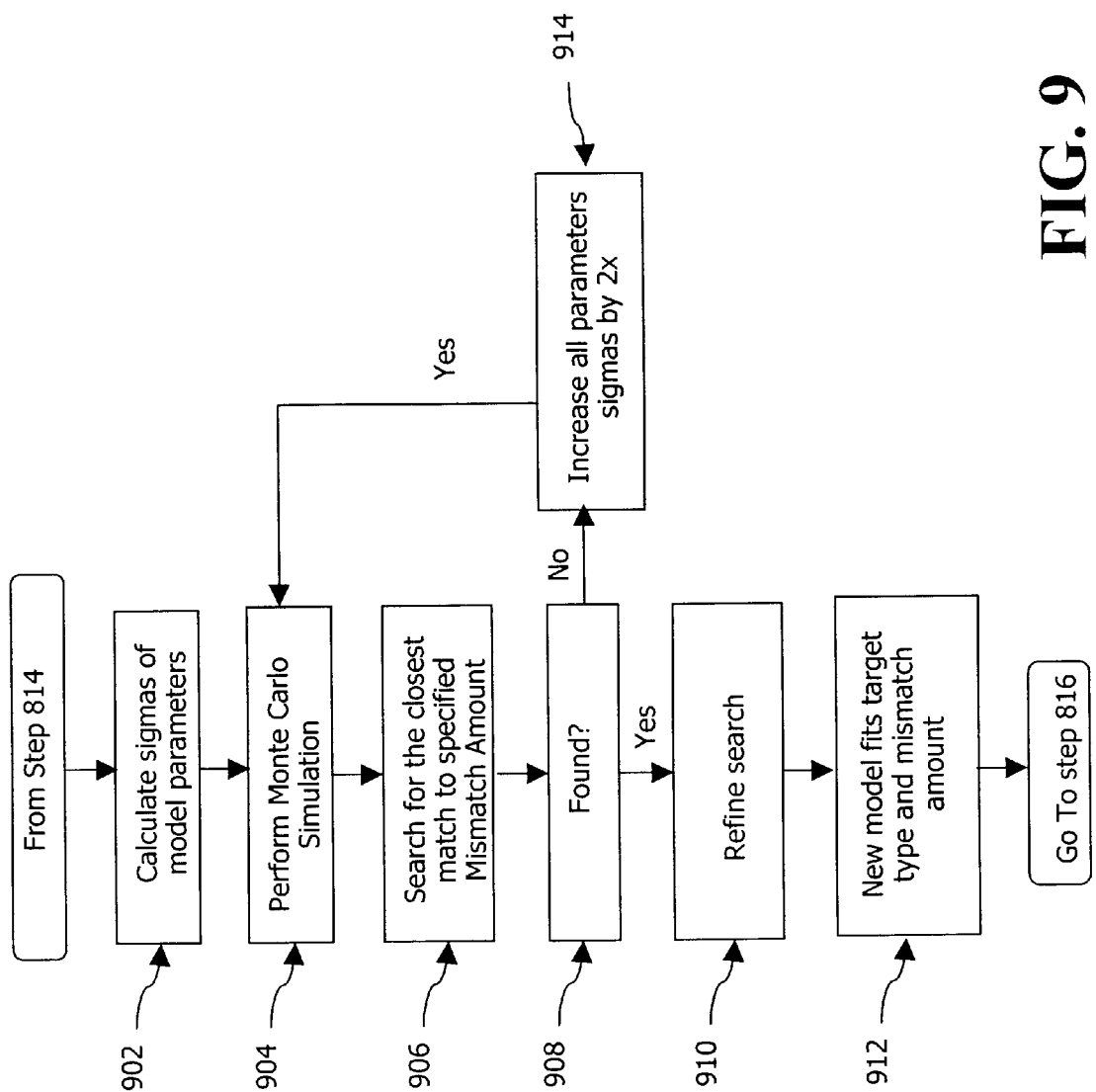
FIG. 9 illustrates an exemplary process in accordance with an embodiment of the invention.

FIG. 9 illustrates an exemplary process of step 814 in accordance with an embodiment of the invention. At step 814, the direct mismatch specifications module 608 has the following information: the user specified target type and mismatch amount, device geometry (from the netlist 101), and bias conditions (e.g., Vgs, Vds, Vbs) for a pair of devices. In addition, a set of model parameters that should be modified to account for the effect of mismatch was selected by the model tool 104 (see step 314) or generated based on the rule file (see step 804). Using the above information, a distribution of mismatch values for each of the set of model parameters is calculated (step 902). The distribution of mismatch values are added to the model parameters and the effect of mismatch is captured. These modified model parameters are plugged back into a model equation for the pair of devices to be simulated. Next, Monte Carlo simulations are performed to generate a distribution of differences in device performance (in terms of the user specified target type) using the modified model parameters (step 904). In one embodiment, the user is prompted to specify the number of Monte Carlo simulations desired. In another embodiment, a default number is automatically generated. The distribution resulting from Monte Carlo simulations is reviewed to verify that the distribution includes the user specified mismatch amount and a closest match to the mismatch amount is identified (step 906). If such a match is found (step 908), a user may optionally refine the search (step 910). After a search refinement, distributions of mismatch values (sigmas) that fits the user specified target type and mismatch amount are found (step 912).

Referring back to step 908, if the closest match is not found, all mismatch values (or sigmas) are increased by a factor of 2 (step 914) and the process repeats at step 904. In an exemplary embodiment, step 914 is performed three times (i.e., the mismatch values are increased to a maximum of eight times their originally calculated values). If a closest match is still not found after step 914 is performed three times, the user is prompted to re-enter or re-select a mismatch amount and/or target type.

Figure 10:
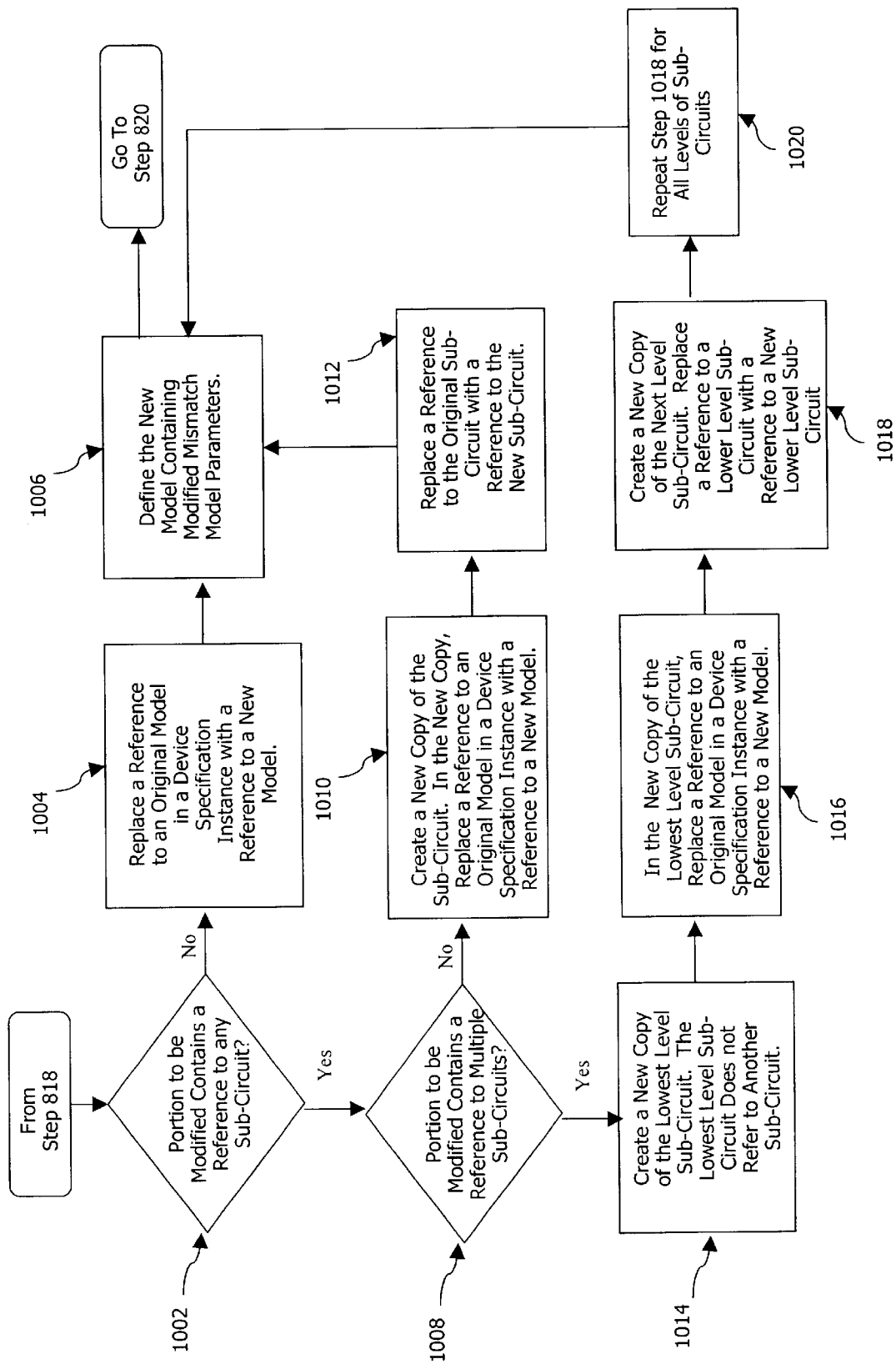
FIG. 10 illustrates an exemplary process in accordance with an embodiment of the invention.

FIG. 10 illustrates an exemplary process of step 818 in accordance with an embodiment of the invention. At step 818, a new model, one that has been modified with mismatch model parameters, is attached to the original netlist 101. At step 1002, whether the portion within the original netlist to be modified contains a reference to any sub-circuit is determined. If it does not, in a device specification instance, a reference to an original model is replaced with a reference to a new model (step 1004). The new model is defined to include the modified model parameters (step 1006).

Referring back to step 1002, if the portion within the original netlist to be modified contains a reference to a sub-circuit, a new copy of the definition of the sub-circuit is created (steps 1008–1010). The new sub-circuit includes at least one device specification instance that references to an original model that should be modified to include modified model parameters. The reference to the original model in the device specification instance is replaced with a reference to a new model (step 1010). Next, a reference to the original sub-circuit in a sub-circuit specification instance is replaced by a reference to the new sub-circuit (step 1012). The new model is defined to include the modified model parameters (step 1006).

Referring back to step 1008, if the portion within the original netlist to be modified contains references to multiple sub-circuits, a new copy of the definition of the lowest level sub-circuit is created (step 1014). The lowest level sub-circuit is a sub-circuit which does not refer to another sub-circuit within its definition. The new lowest level sub-circuit includes at least one device specification instance that references to an original model that should be modified to include modified model parameters. The reference to the original model in the device specification instance is replaced with a reference to a new model (step 1016). Next, a new copy of the definition of the next level sub-circuit is created and any reference in the next level sub-circuit to an original lower level sub-circuit(s) is replaced by a reference to a new lower level sub-circuit (step 1018). Repeat step 1018 until all levels of sub-circuits have been processed (step 1020). The new model is defined to include the modified model parameters (step 1006).

Figure 11:
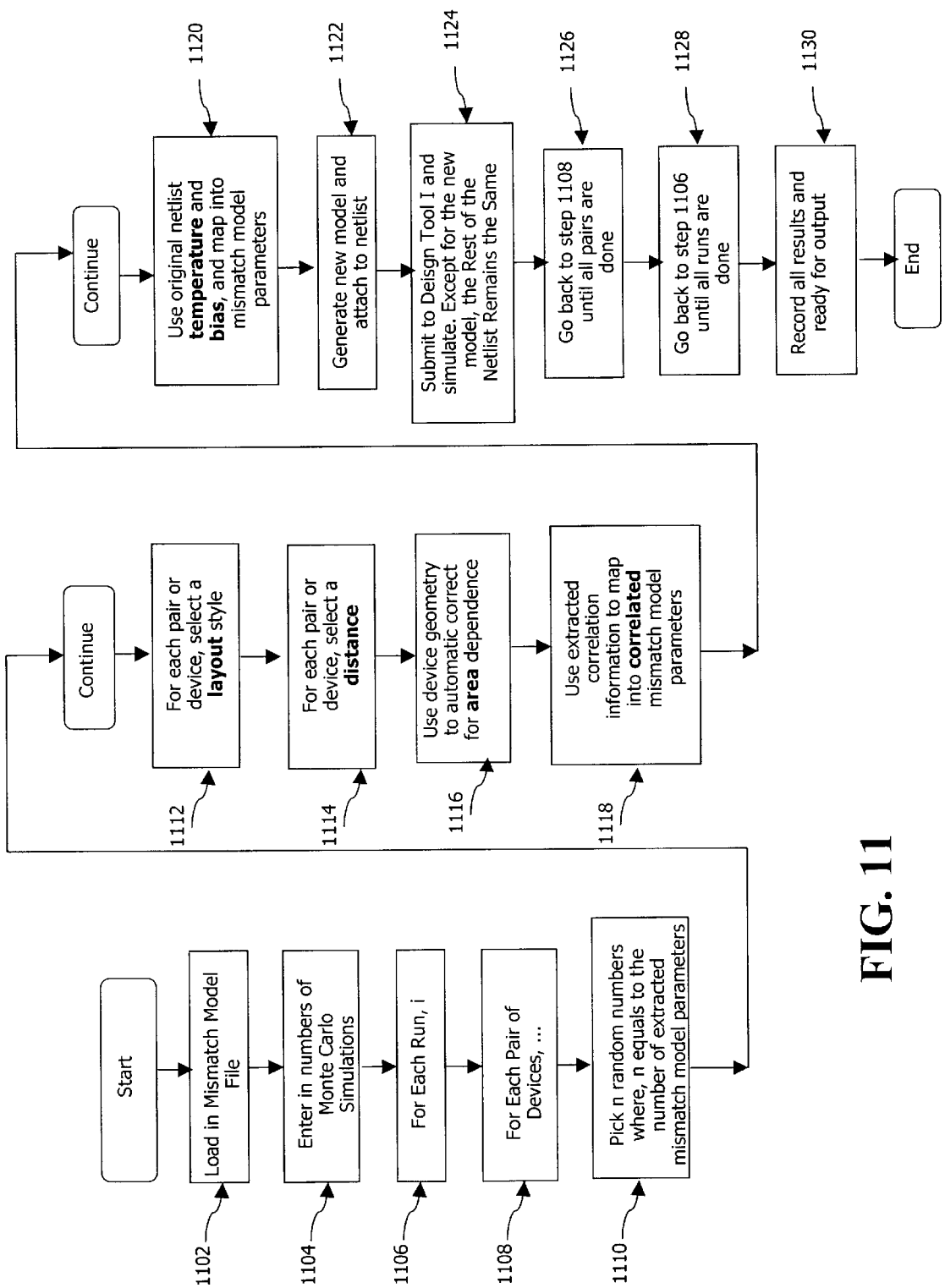
FIG. 11 illustrates an exemplary process in accordance with an embodiment of the invention.

FIG. 11 illustrates an exemplary process performed by the automatic parameter specifications module 610 in accordance with an embodiment of the invention. At step 1102, a mismatch model file is loaded. A user is prompted to enter a number of Monte Carlo simulations desired (step 1104). For each Monte Carlo simulation, i, (step 1106) and for each pair of devices to be simulated (step 1108), "n" random numbers are generated (step 1110), where "n" is equal to the number of selected mismatch model parameters (see step 314). Next, for each pair of devices, select a layout style (step 1112) and a distance within the layout style (step 1114). Use device geometry from the mismatch model file of the first pair of devices to automatically correct for mismatch area dependence (step 1116). Use extracted correlation information from the mismatch model file to map into correlated mismatch model parameters (step 1118). Use original netlist 101 temperature and bias conditions to map into mismatch model parameters (step 1120). Generate a new model based on the mapping steps and attach the new model to the original netlist 101 (step 1122). In an exemplary embodiment, step 1122 is performed in accordance with FIG. 10. Submit the modified netlist to the Design tool 112 to be simulated (step 1124). Repeat steps 1108–1122 until all selected pairs of devices have been processed (step 1126). Repeat steps 1106–1126 until all Monte Carlo runs, i, are completed. Simulation results are recorded and sent to the output interface 128 (step 1130).

The modeling tool 104 and simulation tool 106 of this invention can be plugged into any design flow, jointly or independently, to simulate the effect of mismatch of individual devices or sub-circuits within an integrated circuit. This invention is advantageous because it allows circuit designers to simulate the effect of mismatch during the design process, thus, minimizing circuit failure caused by device or circuit mismatch.

The foregoing examples illustrate certain exemplary embodiments of the invention from which other embodiments, variations, and modifications will be apparent to those skilled in the art. The invention should therefore not be limited to the particular embodiments discussed above, but rather is defined by the claims.

What is claimed is:

1. A method for simulating the effect of mismatch in design flows, comprising:

receiving measured data;

receiving an original model;

extracting a mismatch model based on said measured data and said original model;

attaching said mismatch model to a netlist to obtain a modified netlist; and simulating an effect of mismatch based on said modified netlist.

2. The method of claim 1, wherein said extracting a mismatch model includes:

selecting a set of model parameters;

generating a distribution of mismatch values for each of said model parameters;

extracting a set of linking coefficients based on said mismatch values; and extracting said mismatch model based on said set of linking coefficients.

3. The method of claim 2, wherein said selecting includes:

adding a value to a model parameter;

performing a device performance simulation based on said model parameter;

repeating said adding and performing for all model parameters;

ranking said model parameters based on said device performance simulation; and selecting a set of model parameters based on said ranking.

4. The method of claim 2, wherein said selecting includes:

adding a value to a model parameter;

performing a sub-circuit performance simulation based on said model parameter;

repeating said adding and performing for all model parameters;

ranking said model parameters based on said sub-circuit performance simulation; and selecting a set of model parameters based on said ranking.

5. The method of claim 1, wherein said attaching said mismatch model to a netlist includes:

determining a number of layers in said netlist;

generating a copy of a lower layer in said netlist, said copy including a reference to a mismatch model definition;

generating a copy of a higher layer in said netlist;

replacing a reference to said lower layer in said higher layer by a reference to said copy of said lower layer; and generating a new model definition.

6. The method of claim 5, wherein said lower layer includes a device specification instance and said higher layer includes a sub-circuit specification instance.

7. A method for extracting a mismatch model, said mismatch model for simulating the effect of mismatch in design flows, comprising:

receiving measured data;

receiving an original model;

selecting a set of model parameters;

generating a distribution of mismatch values for each of said model parameters based on said measure data and said original model;

extracting a set of linking coefficients based on said mismatch values; and extracting a mismatch model based on said set of linking coefficients.

8. The method of claim 7, wherein said selecting includes:

adding a value to a model parameter;

performing a device performance simulation based on said model parameter;

repeating said adding and performing for all model parameters;

ranking said model parameters based on said device performance simulation; and selecting a set of model parameters based on said ranking.

9. The method of claim 7, wherein said selecting includes:

adding a value to a model parameter;

performing a sub-circuit performance simulation based on said model parameter;

repeating said adding and performing for all model parameters;

ranking said model parameters based on said sub-circuit performance simulation; and selecting a set of model parameters based on said ranking.

10. The method of claim 7, wherein said generating includes:
   generating a number of target values;
   performing a set of simulations for each of said model parameters based on said target values; and
   generating a distribution of mismatch values for each of said model parameters based on said simulations.

11. The method of claim 10, further comprising: generating correlations among said set of model parameters based on said mismatch values.

12. A method for simulating the effect of mismatch in design flows, comprising:
   extracting a set of modified model parameters based on a netlist and a mismatch model file, said mismatch model file including at least one linking coefficient to account for mismatch in device performance for similarly or identically designed devices;
   attaching said set of modified model parameters to said netlist to obtain a modified netlist;
   simulating said modified netlist; and
   outputting results based on said simulating.

13. The method of claim 12, wherein said extracting a set of modified model parameters includes:
   receiving a target type and a mismatch amount;
   determining a set of bias conditions; and
   fitting said target type and said mismatch amount under said bias conditions based on said mismatch model file and said netlist information.

14. The method of claim 13, wherein said determining a set of bias conditions includes:
   commenting out an original analysis operation;
   performing an operating point analysis; and
   restoring said original analysis operation.

15. The method of claim 12, wherein said extracting said modified model parameters includes:
   receiving a user selection to simulate individual devices;
   assigning a dummy device to each individual device;
   simulating said individual device and said dummy device; and
   generating said modified model parameters based on said simulating and said set of linking coefficients.

16. The method of claim 12, wherein said extracting said modified model parameters includes:
   receiving a user selection to simulate device in pairs;
   simulating said pairs; and
   generating said modified model parameters based on said simulating and said set of linking coefficients.

17. The method of claim 12, wherein said attaching includes:
   determining a number of layers in said netlist;
   generating a copy of a lower layer in said netlist, said copy including a reference to a mismatch model definition;
   generating a copy of a higher layer in said netlist;
   replacing a reference to said lower layer in said higher layer by a reference to said copy of said lower layer; and
   generating a new model definition.

18. A computer program product for use in conjunction with a computer system, said computer program product for simulating the effect of mismatch in design flows, comprising:
   logic code for receiving measured data;
   logic code for receiving an original model;
   logic code for extracting a mismatch model based on said measured data and said original model;
   logic code for attaching said mismatch model to a netlist to obtain a modified netlist; and
   logic code for simulating an effect of mismatch based on said modified netlist.

19. The computer program product of claim 18, wherein said logic code for extracting a mismatch model includes:
   logic code for selecting a set of model parameters;
   logic code for generating a distribution of mismatch values for each of said model parameters;
   logic code for extracting a set of linking coefficients based on said mismatch values; and
   logic code for extracting said mismatch model based on said set of linking coefficients.

20. The computer program product of claim 19, wherein said logic code for selecting a set of model parameters includes:
   logic code for adding a value to a model parameter;
   logic code for performing a device performance simulation based on said model parameter;
   logic code for repeating said logic code for adding and said logic code for performing for all model parameters;
   logic code for ranking said model parameters based on said device performance simulation; and
   logic code for selecting a set of model parameters based on said ranking.

21. The computer program product of claim 18, wherein said logic code for attaching said mismatch model to said netlist includes:
   logic code for determining a number of layers in said netlist;
   logic code for generating a copy of a lower layer in said netlist, said copy including a reference to a mismatch model definition;
   logic code for generating a copy of a higher layer in said netlist;
   logic code for replacing a reference to said lower layer in said higher layer by a reference to said copy of said lower layer; and
   logic code for generating a new model definition.

22. The computer program product of claim 21, wherein said lower layer includes a device specification instance and said higher layer includes a sub-circuit specification instance.

23. A computer program product for use in conjunction with a computer system, said computer program product for extracting a mismatch model, said mismatch model for simulating the effect of mismatch in design flows, comprising:
   logic code for receiving measured data;
   logic code for receiving an original model;
   logic code for selecting a set of model parameters;
   logic code for generating a distribution of mismatch values for each of said model parameters based on said measure data and said original model;
   logic code for extracting a set of linking coefficients based on said mismatch values; and
   logic code for extracting a mismatch model based on said set of linking coefficients.

24. The computer program product of claim 23, wherein said logic code for selecting includes:

logic code for adding a value to a model parameter;

logic code for performing a device performance simulation based on said model parameter;

logic code for repeating said logic code for adding and said logic code for performing for all model parameters;

logic code for ranking said model parameters based on said device performance simulation; and logic code for selecting a set of model parameters based on said ranking.

25. The computer program product of claim 23, wherein said logic code for selecting includes:

logic code for adding a value to a model parameter;

logic code for performing a sub-circuit performance simulation based on said model parameter;

logic code for repeating said logic code for adding and said logic code for performing for all model parameters;

logic code for ranking said model parameters based on said sub-circuit performance simulation; and logic code for selecting a set of model parameters based on said ranking.

26. The computer program product of claim 23, wherein said logic code for generating includes:

logic code for generating a number of target values;

logic code for performing a set of simulations for each of said model parameters based on said target values; and logic code for generating a distribution of mismatch values for each of said model parameters based on said simulations.

27. The computer program product of claim 26, further comprising: logic code for generating correlations among said set of model parameters based on said mismatch values.

28. A computer program product for use in conjunction with a computer system, said computer program product for simulating the effect of mismatch in design flows, comprising:

logic code for extracting a set of modified model parameters based on a netlist and a mismatch model file, said mismatch model file including at least one linking coefficient to account for mismatch in device performance for similarly or identically designed devices;

logic code for attaching said set of modified model parameters to said netlist to obtain a modified netlist;

logic code for simulating said modified netlist; and logic code for outputting results based on said simulating.

29. The computer program product of claim 28, wherein said logic code for extracting a set of modified model parameters includes:

logic code for receiving a target type and a mismatch amount;

logic code for determining a set of bias conditions; and logic code for fitting said target type and said mismatch amount under said bias conditions based on said mismatch model file and said netlist information.

30. The computer program product of claim 29, wherein said logic code for determining a set of bias conditions includes:

logic code for commenting out an original analysis operation;

logic code for performing an operating point analysis; and logic code for restoring said original analysis operation.

31. The method of claim 28, wherein said logic code for extracting said modified model parameters includes:

logic code for receiving a user selection to simulate individual devices;

logic code for assigning a dummy device to each individual device;

logic code for simulating said individual device and said dummy device; and logic code for generating said modified model parameters based on said simulating and said set of linking coefficients.

32. The method of claim 28, wherein said logic code for extracting said modified model parameters includes:

logic code for receiving a user selection to simulate device in pairs;

logic code for simulating said pairs; and logic code for generating said modified model parameters based on said simulating and said set of linking coefficients.

33. The computer program product of claim 28, wherein said logic code for attaching includes:

logic code for determining a number of layers in said netlist;

logic code for generating a copy of a lower layer in said netlist, said copy including a reference to a mismatch model definition;

logic code for generating a copy of a higher layer in said netlist;

logic code for replacing a reference to said lower layer in said higher layer by a reference to said copy of said lower layer; and logic code for generating a new model definition.

34. An apparatus for simulating the effect of mismatch in design flows, comprising:

a modeling tool; and a simulation tool;

wherein said modeling tool extracts a mismatch model based on measured data received from test wafers and an original model; and wherein said simulation tool attaches said mismatch model to said netlist to obtain a modified netlist and simulates an effect of mismatch based on said modified netlist.

35. The apparatus of claim 34, wherein said modeling tool further comprises:

a first module for selecting a set of model parameters;

a second module for generating a distribution of mismatch values for each of said model parameters;

a third module for extracting a set of linking coefficients based on said mismatch values; and a fourth module for extracting said mismatch model based on said set of linking coefficients.

36. The apparatus of claim 35, wherein said first module for selecting includes:

a first sub-module for adding a value to a model parameter;

a second sub-module for performing a device performance simulation based on said model parameter;

a third sub-module for repeating said adding and performing for all model parameters;

a fourth sub-module for ranking said model parameters based on said device performance simulation; and a fifth sub-module for selecting a set of model parameters based on said ranking.

37. An apparatus for extracting mismatch values, said mismatch values for simulating the effect of mismatch in design flows, comprising:

an input interface;

a mismatch extraction module; and an output interface;

wherein said input interface receives measured data and an original model; and wherein said mismatch extraction module selects a set of model parameters, generates a distribution of mismatch values for each of said model parameters based on said measure data and said original model, and extracts a set of linking coefficients based on said mismatch values, and extracts a mismatch model based on said set of linking coefficients.

38. The apparatus of claim 37, further comprising a mismatch value verification module for comparing said mismatch values to simulation results.

39. The apparatus of claim 37, wherein said mismatch extraction module further comprises a parameter selection sub-module for:

adding a value to a model parameter;

performing a device performance simulation based on said model parameter;

repeating said adding and performing for all model parameters;

ranking said model parameters based on said device performance simulation; and selecting a set of model parameters based on said ranking.

40. The apparatus of claim 37, wherein said mismatch extraction module further comprises a mismatch value generation sub-module for:

generating a number of target values;

performing a set of simulations for each of said model parameters based on said target values; and generating a distribution of mismatch values for each of said model parameters based on said simulations.

41. The apparatus of claim 40, further comprising a correlation extraction sub-module for generating correlations among said set of model parameters based on said mismatch values.

42. An apparatus for simulating the effect of mismatch in design flows, comprising:

an input interface;

a simulator; and an output interface;

wherein said simulator extracts a set of modified model parameters based on a netlist and a mismatch model file received through said input interface, said mismatch model file including at least one linking coefficient to account for mismatch in device performance for similarly or identically designed devices;

wherein said simulator attaches said set of modified model parameters to said netlist to obtain a modified netlist, and simulates said modified netlist; and wherein said output interface outputs results of said simulation performed by said simulator.

43. The apparatus of claim 42, wherein said simulator further comprises a mismatch model extraction module for:

receiving a target type and a mismatch amount;

determining a set of bias conditions; and fitting said target type and said mismatch amount under said bias conditions based on said mismatch model file and said netlist information.

44. The apparatus of claim 42, wherein said mismatch model extraction module includes an operating point analysis sub-module for:

commenting out an original analysis operation;

performing an operating point analysis; and restoring said original analysis operation.

45. The apparatus claim 42, wherein said simulator further comprises a netlist modification module for:

determining a number of layers in said netlist;

generating a copy of a lower layer in said netlist, said copy including a reference to a mismatch model definition;

generating a copy of a higher layer in said netlist;

replacing a reference to said lower layer in said higher layer by a reference to said copy of said lower layer; and generating a new model definition.

* * * * *